(12) United States Patent
Kim et al.

(10) Patent No.: US 6,284,146 B1
(45) Date of Patent: Sep. 4, 2001

(54) ETCHING GAS MIXTURE FOR TRANSITION METAL THIN FILM AND METHOD FOR ETCHING TRANSITION METAL THIN FILM USING THE SAME

(75) Inventors: Jin-hong Kim; Seong-ihl Woo, both of Taeseon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/627,377

(22) Filed: Jul. 28, 2000

Related U.S. Application Data

(62) Division of application No. 08/874,296, filed on Jun. 13, 1997.

(30) Foreign Application Priority Data

Jun. 13, 1996 (KR) .................................. 96-21235
Feb. 22, 1997 (KR) .................................... 97-5467

(51) Int. Cl.[7] .................................................. C23F 1/02
(52) U.S. Cl. .................................. 216/6; 216/13; 216/67; 216/75
(58) Field of Search ...................... 216/6, 13, 67, 216/75

(56) References Cited

U.S. PATENT DOCUMENTS

| | | | |
|---|---|---|---|
| 4,659,426 | 4/1987 | Fuller et al. ......................... | 438/719 |
| 4,793,897 | 12/1988 | Dunfield et al. ..................... | 438/724 |
| 4,836,886 | 6/1989 | Daubenspeck ........................ | 216/67 |
| 5,024,722 | 6/1991 | Cathey, Jr. .......................... | 438/695 |
| 5,091,050 | * 2/1992 | Fujino et al. ........................ | 156/643 |
| 5,223,113 | * 6/1993 | Kaneko et al. .................. | 204/298.33 |
| 5,259,923 | 11/1993 | Hori et al. ............................. | 216/66 |
| 5,368,687 | 11/1994 | Sandhu et al. ....................... | 156/664 |
| 5,382,320 | 1/1995 | Desu et al. ........................... | 156/667 |
| 5,431,774 | 7/1995 | Douglas ................................ | 216/57 |
| 5,607,599 | * 3/1997 | Ichihara et al. ....................... | 216/22 |
| 5,705,443 | * 1/1998 | Stauf et al. ........................... | 438/722 |

FOREIGN PATENT DOCUMENTS

| | | | |
|---|---|---|---|
| 53020769A | * 2/1978 | (JP) | .............................. H01L/21/30 |
| 05-343366 | 12/1993 | (JP) | . |

OTHER PUBLICATIONS

Nishikawa et al.; Platinum Etching And Plasma Characteristics in RF Magnetron And Electron Cyclotron Resonance Plasmas; *Jpn. J. Appl. Phys.*; vol. 32 (Dec. 1993); pp. 6102–6108.

Chou et al.; Platinum metal etching in a microwave oxygen plasma; *J. Appl. Phys.*; vol. 68(5) (Sep. 1990); pp. 2415–2423.

Yokoyama et al.; High–Temperature Etching of PZT/Pt/TiN Structure by High–Density ECR Plasma; *Jpn. J. Appl. Phys.*; vol. 34 (1995) pp. 767–770.

* cited by examiner

*Primary Examiner*—Alexander Markoff
*Assistant Examiner*—Allan Olsen
(74) *Attorney, Agent, or Firm*—Myers Bigel Sibley & Sajovec, P.A.

(57) ABSTRACT

An etching gas mixture for a transition metal thin film, and an etching method using the etching gas mixture are provided. The etching gas mixture is composed of two gases. The first gas is one selected from the group consisting of halogen gas, halide gas, halogen gas mixture, halide gas mixture and gas mixture of halogen and halide. The second gas is one selected from the group consisting of carbon oxide gas, hydrocarbon gas, nitrogen oxide gas and nitrogen-containing gas. The etching gas mixture reacts with the transition metal thin film to form a highly volatile metal halide, so that a fine pattern can be formed with a high selectivity.

26 Claims, 6 Drawing Sheets

ETCHING GAS MIXTURE FOR TRANSITION METAL THIN FILM AND METHOD FOR ETCHING TRANSITION METAL THIN FILM USING THE SAME

CROSS-REFERENCE TO RELATED APPLICATIONS

The instant application is a divisional application of Ser. No. 08/874,296 filed Jun. 13, 1997, the disclosure of which is incorporated herein by reference in its entirety.

BACKGROUND OF THE INVENTION

1. Field of the Invention

The present invention relates to a gas for fabricating a semiconductor device and a fabrication method using the same, and more particularly, to an etching gas mixture for a transition metal thin film and a method for etching the transition metal thin film using the same.

2. Description of the Related Art

In general, with high integration of semiconductor devices, patterns becomes smaller greatly. Thus, the importance of an etching process directly related to formation of a fine pattern has increased. Also, an etching target has been diversified to improve the characteristics of semiconductor devices, including a transition metal as well as conventional materials such as monosilicon, polysilicon, silicon oxide and aluminum.

Generally, the transition metal thin film is widely used as an electrode material for a capacitor. The transition metal thin film is mainly etched by a reactive ion etching and a low-pressure high-density plasma etching. When etching the transition metal thin film by the reactive ion etching, a product of a chemical reaction between an etching gas and the transition metal thin film, e.g., metal halide, exists in a solid state with a high boiling point, so that a physical etching mainly occurs by collision with accelerated ions. Thus, there is a problem in that an etching by-product, dislodged by the physical ion sputtering, is redeposited on the sidewalls of the pattern. If the etching by-product is redeposited on the sidewalls of the pattern, the profile of the pattern becomes inferior. Thus, when the transition metal thin film is used as an electrode of a capacitor, the electrode may not be totally insulated. Also, the pattern is formed in a trapezoid shape, so that the degree of accuracy of the pattern is decreased. Accordingly, it is impossible to form a fine pattern.

When patterning the transition metal thin film by low-pressure high-density plasma etching, the low pressure gives the effect of lowering the boiling point of a product formed by the reaction of a reaction gas with the transition metal. However, the low-pressure high-density plasma etching method gives only limited improvement of the volatility of an etching product, so that the etching product is still redeposited on the sidewalls of the pattern. Thus, it is impossible to form a fine pattern of a critical dimension or less.

SUMMARY OF THE INVENTION

To solve the above problems, it is an object of the present invention to provide an etching gas mixture for a transition metal thin film, which is capable of forming an etching reaction product having a high volatility, through a reaction with a transition metal thin film.

It is another object of the present invention to provide a method for etching a transition metal thin film, which is capable of forming a fine pattern of a transition metal thin film having few defects.

Accordingly, to achieve the above first object, there is provided an etching gas mixture for a transition metal thin film, comprising: a first gas which is one selected from the group consisting of halogen gas, halide gas, halogen gas mixture, halide gas mixture and gas mixture of halogen and halide; and a second gas which is one selected from the group consisting of carbon oxide gas, hydrocarbon gas, nitrogen oxide gas and nitrogen-containing gas. The etching gas mixture converts the transition metal thin film into a volatile metal halide, and the volatile metal halide comprises one selected from the group consisting of metal carbonyl halide, organic metal halide, metal amine halide and metal nitrosohalide. Here, preferably, the mixing ratio of the first gas to the second gas is 1:0.01~1:100.

To achieve the second object, there is provided a method for etching the transition metal thin film, comprising the steps of loading a semiconductor substrate having the transition metal thin film in a reaction chamber. Then, an etching gas mixture composed of a first gas which is one selected from the group consisting of halogen gas, halide gas, halogen gas mixture, halide gas mixture and gas mixture of halogen and halide, and a second gas which is one selected from the group consisting of carbon oxide gas, hydrocarbon gas, nitrogen oxide gas and nitrogen-containing gas, is injecting into the reaction chamber to form a volatile metal halide through a reaction between the transition metal thin film and the etching gas mixture, thereby etching the transition metal thin film.

Preferably, the mixing ratio of the first gas to the second gas is 1:0.01~1:100, and the mixing ratio of the first gas and the second gas may be controlled to multiple levels.

Here, the step of etching the transition metal thin film in the method comprises the sub-steps of: injecting the etching gas mixture to the reaction chamber under a predetermined pressure. Then, a plasma is formed in the reaction chamber, and then the etching gas mixture is activated in the plasma. The activated etching gas mixture is reacted with the transition metal thin film to form the volatile metal halide. Finally, the volatile metal halide is volatilized. Preferably, the semiconductor substrate is is loaded onto an electrode in the reaction chamber and radio frequency power is applied to the electrode to perform a reactive ion etching.

Also, there is provided a method for etching the transition metal thin film comprising the steps of loading a semiconductor substrate having the transition metal thin film into a reaction chamber. Then, a first gas which is one selected from the group consisting of halogen gas, halide gas, halogen gas mixture, halide gas mixture and gas mixture of halogen and halide, is injected to react with the transition metal thin film, thereby forming a metal halide. Subsequently, a second gas which is one selected from the group consisting of carbon oxide gas, hydrocarbon gas, nitrogen oxide gas and nitrogen-containing gas, is injected to react with the metal halide, thereby forming a volatile metal halide.

Here, the step of forming the metal halide comprises the sub-steps of injecting the first gas into the reaction chamber under a predetermined pressure. Then, radio frequency power is applied to an electrode in the reaction chamber to form a plasma. Then, the first gas is activated in the plasma. Finally, the activated first gas is reacted with the transition metal thin film to form the metal halide.

Also, the step of forming the volatile metal halide comprises the sub-steps of stopping the injection of the first gas.

Then, the second gas is injected into the reaction chamber, to react with the metal halide, thereby forming the volatile metal halide. Here, preferably, in the step of forming the volatile metal halide by injecting the second gas, the radio frequency power is not applied to the electrode of the reaction chamber, such that the plasma is not formed and a reaction between the second gas and the surface of the metal halide occurs. Also, it is preferable to repeatedly perform the steps of forming the metal halide and the volatile metal halide in sequence.

In the present invention, preferably, the transition metal thin film comprises one selected from the group consisting of tungsten (w), molybdenum (Mo), ruthenium (Ru), iron (Fe), iridium (Ir), rhodium (Rh), platinum (Pt), nickel (Ni), copper (Cu) and gold (Au). The halogen gas may comprise one selected from the group consisting of chlorine ($Cl_2$), fluorine ($F_2$), bromine ($Br_2$) and iodine ($I_2$), and the halide gas may comprise one selected from the group consisting of chloride gas, fluoride gas, bromide gas and iodide gas. The carbon oxide gas may comprise one selected from the group consisting of carbon monoxide (CO), carbon dioxide ($CO_2$) and carbonyl compound. The hydrocarbon gas may comprise one selected from the group consisting of benzene, cyclopentadiene, toluene and butadiene. The nitrogen-containing gas may be ammonia ($NH_3$). The nitrogen oxide gas may comprise one selected from the group consisting of nitrogen monoxide (NO) and nitrogen dioxide ($NO_2$).

Preferably, the temperature of the reaction chamber is 0~500° C., and the temperature at the wall of the reaction chamber is higher than that the semiconductor substrate, such that the volatile metal halide is easily volatilized. Also, is it is preferably that the pressure of the reaction chamber is $1 \times 10^{-4}$ Torr~$7.6 \times 10^3$ Torr.

According to the present invention, a highly volatile metal halide, which is easily vaporized or sublimated at a low temperature, is formed by the reaction of the transition metal thin film and the etching gas. Thus, the transition metal thin film can be patterned at a high etching rate, without resulting in the by-product being redeposited on the transition metal thin film pattern. Also, as the etching is performed by a chemical reaction, a high selectivity with respect to a mask or an under material layer can be achieved.

DESCRIPTION OF THE PREFERRED EMBODIMENT

The present invention now will be described more fully hereinafter with reference to the accompanying drawings, in which preferred embodiments of the invention are shown. This invention may, however, be embodied in many different forms and should not be constructed as limited to the embodiments set forth herein; rather, these embodiments are provided so that this disclosure will be thorough and complete, and will fully convey the scope of the invention to those skilled in the art.

Figure 1:
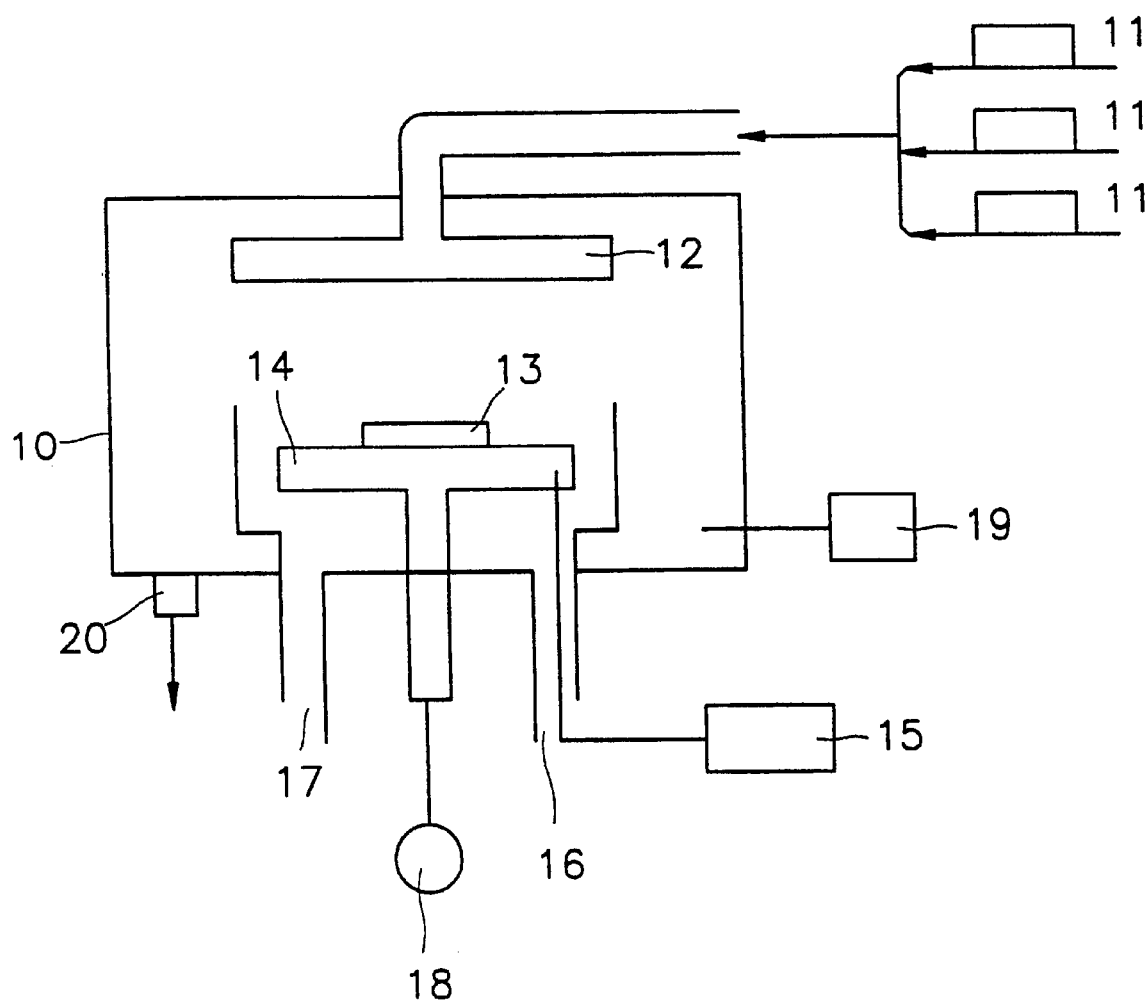
FIG. 1 is a diagram of an etching apparatus used in the present invention.

A method for etching a transition metal thin film using an etching gas mixture for a transition metal, according to the present invention, will be described with reference to the etching apparatus for the transition metal thin film of FIG. 1.

A semiconductor substrate 13, in which a mask pattern for patterning a transition metal thin film into a predetermined pattern is formed on the transition metal thin film, e.g., for forming a lower electrode of a capacitor, is loaded into a holder (not shown) of a lower electrode 14 within a reaction chamber 10. Here, the mask pattern being used may be a photoresist pattern, a nitride layer pattern or an oxide layer pattern. Also, the transition metal thin film is formed of one of elements belonging to VI, VIII and IB groups, e.g., tungsten (W), molybdenum (Mo), ruthenium (Ru), iron (Fe), iridium (Ir), rhodium (Rh), platinum (Pt), nickel (Ni), copper (Cu) or gold (Au). Also, a titanium (Ti) layer or a titanium nitride (TiN) layer may be formed as a diffusion barrier layer below the transition thin film. Also, a BST(($Ba,Sr)TiO_3$), STO($SrTiO_3$), PZT($PbZr_xTi_{1-x}O_3$) or PLZT(La-doped PZT) layer may be further formed on the transition metal thin film.

The temperatures of the semiconductor substrate 13 and the reaction chamber 10 are controlled to 0~500° C. by a temperature controller 15 and cooling means 16 and 17. This temperature range is lower compared with that of a conventional dry etching method. Preferably, the temperature at the walls of the reaction chamber 10 is controlled to be higher than that of the semiconductor substrate 13. The reason is that if the temperature at the wall of the reaction chamber 10 is lower than that of the semiconductor substrate 13, a volatilized etching product is liquefied or solidified, and can act as a contaminant.

Also, the pressure within the reaction chamber 10 is controlled to $1 \times 10^{-4}$Torr~$7.6 \times 10^3$Torr by using a pressure sensor 19 and exhaust means 20, preferably, to $1 \times 10^{-4}$Torr~$7.6 \times 10^2$Torr, and more particularly, to $1 \times 10^{-3}$~2Torr.

Then, a gas mixture, including a first gas selected from the group consisting of halogen gas, halide gas, halogen gas mixture, halide gas mixture and gas mixture of halogen and halide, and a second gas selected from the group consisting of carbon oxide gas, hydrocarbon gas, nitrogen oxide gas and nitrogen-containing gas with a mixing ratio of 1:0.01~1:100, is injected from a gas supplier 11 having a mass flow rate controller (not shown) to the reaction chamber 10. The injected gas is spread over the reaction chamber 10 via a gas diffuser (not shown) of an upper electrode 12. Here, the mixing ratio of the gas mixture may be controlled to various levels during the etching. Radio frequency (RF) power is applied to the lower electrode 14 using a power supply means 18 to form a plasma within the reaction chamber 10. When the plasma is formed, the etching gas mixture is activated within the reaction chamber 10. The activated etching gas mixture reacts with the transition metal thin film to form a volatile metal halide. Also, if a power higher than that needed to form a plasma is applied to the lower electrode 14, a reactive ion etching can be performed.

The halogen gas of the first gas is one selected from the group consisting of chlorine ($Cl_2$), fluorine ($F_2$), bromine ($Br_2$) and iodine ($I_2$), and the halide gas is one selected from the group consisting of chloride gas, fluoride gas, bromide gas and iodide gas. Also, the carbon oxide gas of the second gas is one selected from the group consisting of carbon monoxide (CO), carbon dioxide ($CO_2$) and carbonyl compound; the hydrocarbon gas is one selected from the group consisting of benzene, cyclopentadien, toluene and butadiene; the nitrogen-containing gas is ammonia (NH3); and the nitrogen oxide gas is one selected from the group consisting of nitrogen monoxide (NO) and nitrogen dioxide ($NO_2$)

When the carbon oxide gas is used as the second gas, a volatile metal halide, generated by the reaction with the transition metal, is a metal carbonyl halide; a volatile compound generated by the reaction with the hydrocarbon gas is an organic metal halide; a volatile compound generated by the reaction with the nitrogen-containing gas is a metal amine halide; and a volatile compound generated by the reaction with the nitrogen oxide gas is a metal nitrosohalide. The volatile metal halides all have a lower boiling point, and can be volatilized at a lower temperature within the reaction chamber 10. After completing the etching process, the power supply means 18 is deactivated, and the etching gas and the vaporized or sublimated volatile metal halide are exhausted.

In order to control the etching characteristics, one selected from the group consisting of oxygen, nitrogen, fluorocarbon, vapor and inert gas may be further injected as a third gas from a gas supplier 11 to the reaction chamber 10, as well as the first and second gases. The third gas evenly disperses the gas mixture of the first and second gases within the reaction chamber 10, to evenly control the reaction rate of the transition metal thin film with the etching gas, to a predetermined level.

In the above-described method, a gas mixture in which the mixing ratio of the first and second gases is 1:0.01~1:100 is injected. However, according to another embodiment of the present invention, the etching may be performed by injecting the first gas to convert the transition metal into a metal halide, and then the second gas to convert the metal halide to a volatile metal halide.

In detail, the first gas is injected into the reaction chamber 10 via the gas supplier 11 and the gas diffuser installed at the upper electrode 12. The pressure of the reaction chamber 10 is controlled to $1 \times 10^{-4}$ Torr~$7.6 \times 10^{3}$ Torr by using the pressure sensor 19 and the exhaust means 20, preferably, to $1 \times 10^{-4}$ Torr~$7.6 \times 10^{2}$ Torr, more particularly, to $1 \times 10^{-3}$~2Torr. Then, the RF power is applied to the lower electrode 14 using the power supply means 18, to form a plasma within the reaction

TABLE 1

| Transition Metal | first chemical compound (e.g., gas) | second chemical compound (e.g., gas) | Etching Temperature (° C., 1atm) | etching rate (Å/min) |
| --- | --- | --- | --- | --- |
| Ru | fluoride, chloride, bromide | carbon monoxide, carbon dioxide, nitrogen monoxide, nitrogen dioxide | 0–400 | 100–3,000 |

TABLE 1-continued

| Transition Metal | first chemical compound (e.g., gas) | second chemical compound (e.g., gas) | Etching Temperature (° C., 1atm) | etching rate (Å/min) |
| --- | --- | --- | --- | --- |
| Fe | fluoride, chloride, bromide | carbon monoxide, carbon dioxide, nitrogen monoxide | 100–300 | 100–3,000 |
| Rh | fluoride, chloride | carbon monoxide, carbon dioxide, nitrogen monoxide, ammonia | 100–300 | 100–1,000 |
| Ir | fluoride, chloride, bromide, iodide | carbon monoxide, carbon dioxide, vapor, nitrogen monoxide | 150–350 | 500–2,000 |
| Pt | chloride, fluoride, iodide | carbon monoxide, carbon dioxide, vapor, nitrogen monoxide | 0–500 | 100–3,000 |
| Ni | chloride, bromide, iodide | carbon monoxide, carbon dioxide, vapor, nitrogen monoxide, nitrogen dioxide | 0–300 | 1,000–3,000 |
| Cu | chloride, | Nitrate | 150–250 | 500–2,500 |
| Au | chloride, bromide, iodide | nitrogen monoxide, nitrogen dioxide | 200–300 | 300–1,000 |
| Mo | fluoride, chloride, bromide, | carbon monoxide, carbon dioxide | 100–250 | 200–1,500 |
| W | fluoride, chloride, bromide, iodide | carbon monoxide, carbon dioxide | 0–400 | 500–3,000 |

Pt has been widely used as an electrode material for a Capacitor, due to its low reactivity to oxygen and high degree of work function. Thus, Pt is capable of reducing a leakage. chamber 18, thereby activating the first gas. The activated first gas reacts with the transition metal thin film to form a metal halide. Then, the injection of the first gas is stopped and the second gas is injected into the reaction chamber via gas supplier 11. During the supply of the second gas, the RF power may or may not be applied to the lower electrode 14. If the power supply means 18 is deactivated, so the power is not applied, the plasma is not formed. In this case, a volatile metal halide is formed by a surface chemical reaction between the second gas and the metal halide. Here, the transition metal thin film may be completely removed by repeatedly injecting the first and second gases in sequence, after the injection of the second gas. Also, the injection of the first and the second gases may be performed independently in different etching chambers of a multi-chamber system, as well as in the same chamber. When the first and second gases are injected in different etching chambers, the processing conditions such as temperature, pressure or RF frequency power may be set differently.

Each transition metal, preferable examples of the first and second gases, etching temperature and etching time are shown in Table 1.

As can be seen from Table 1, the etching can be performed in the temperature range of 0~500° C., and the etching rate is very high, at 100~3,000 Å/min.

In the following examples, an etching method, using a Pt thin film from among the transition metal thin films, will be described. current density and maintaining a high dielectric constant of a ferroelectric material. When the Pt thin film reacts with the etching gas of the present invention, including a halogen gas being one selected from the group consisting of $Cl_2$, $Br_2$ and $I_2$, and carbon oxide gas including carbon monoxide or carbon dioxide, the following chemical reaction occurs.

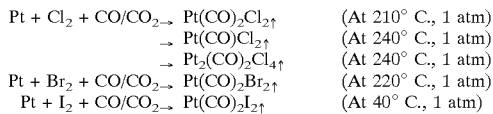

That is, the volatile metal halides formed by the above reaction formulas are easily vaporized or sublimated at a low temperature of 40~240° C.

In the case of sequentially injecting the halogen gas and the carbon oxide gas instead of using the gas mixture, the following Pt halides are formed by reacting Pt with one halogen gas selected from the group consisting of $Cl_2$, $Br_2$ and $I_2$. The obtained halides are scarcely volatile.

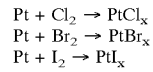

However, when reacting the carbon oxide gas such as carbon monoxide or carbon dioxide with the Pt halides, the following volatile carbonyl halides are formed.

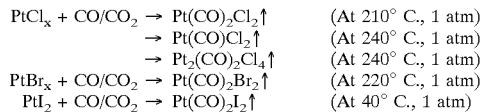

That is, it can be seen that the products formed by the reaction of the etching gas mixture and the end products formed by reacting each etching gas step by step are the same highly volatile metal carbonyl halide, such as $Pt(CO)_2Cl_2$, $Pt(CO)Cl_2$, $Pt_2(CO)_2Cl_4$, $Br(CO)_2Br_2$ or $Pt(CO)_2I_2$.

EXAMPLE 1

The following experiment was performed in order to investigate the relationship of the reaction chamber pressure with the Pt thin film etching rate, and the etching selectivity of the Pt thin film with respect to an oxide layer. A silicon oxide layer as an interlayer dielectric (IDL) film was formed to a thickness of 5,000 Å on a semiconductor substrate having a source/drain region. Then, a contact hole for exposing the source region was formed. The contact hole was filled with Pt. The Pt thin film was deposited on the silicon oxide layer to a thickness of 3,000 Å. A photoresist pattern for patterning the Pt thin film into a predetermined pattern was formed, and the semiconductor substrate was loaded into the holder of the lower electrode 14 within the reaction chamber 10. Next, the temperature was controlled to 250° C. by the temperature controller 15 and the cooling means 16 and 17. Then, a gas mixture of chlorine and carbon monoxide was injected to the reaction chamber. Here, the mixing ratio of chlorine to carbon monoxide in the gas mixture was 1:2.3. While varying the pressure between 200 mTorr and 5 mTorr using the pressure sensor 19 and the exhaust means 20, the etching rate of the Pt thin film, and the etching selectivity of the Pt thin film with respect to the oxide layer were measured at each pressure.

Figure 2:
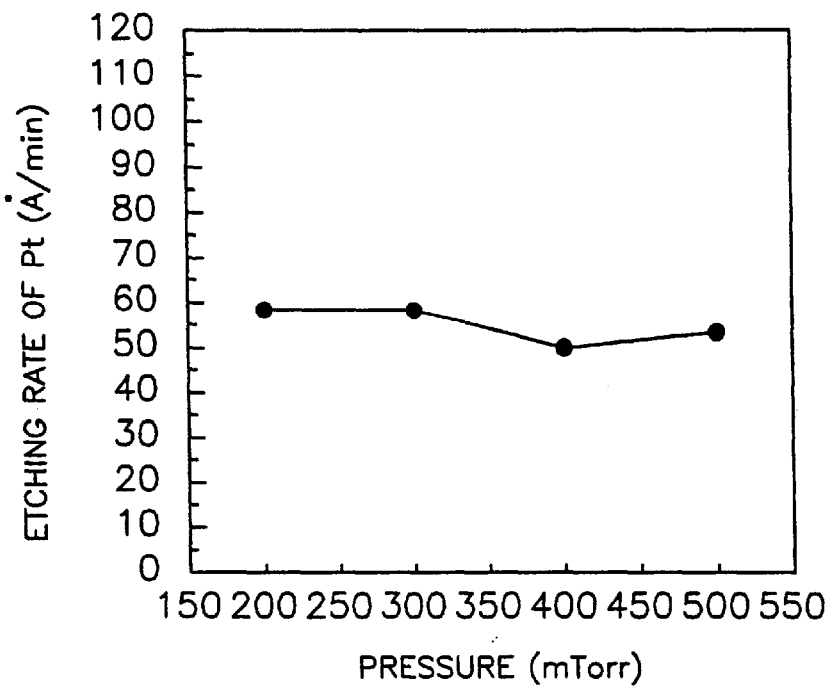
FIG. 2 is a diagram showing the relationship between the pressure and the etching rate of a platinum (Pt) thin film.
Figure 3:
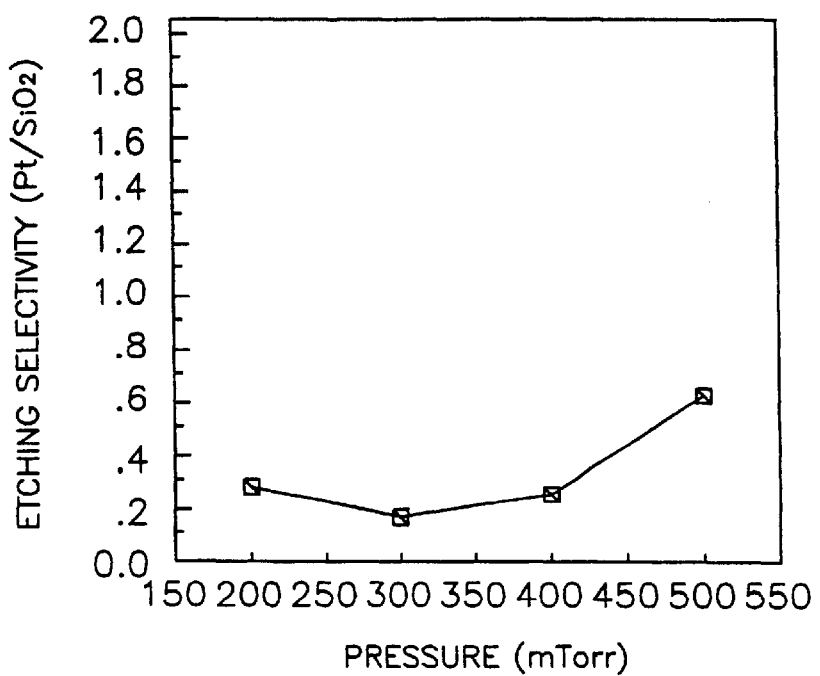
FIG. 3 is a graph showing the relationship between the pressure and the etching selectivity of Pt thin film with respect to an oxide layer.

FIG. 2 shows the etching rate of the Pt thin film and FIG. 3 shows the etching selectivity of the Pt thin film with respect to the oxide layer. From FIG. 2, it can be seen that the etching rate of the Pt thin film decreases as the pressure increases. Also, it can be seen from FIG. 3 that the etching selectivity with respect to the oxide layer increases as the pressure increases. From the fact that the rate of change of the etching selectivity is greater than that of the etching rate, it can be seen that the etching rate of the oxide layer decreases fast compared with the etching rate of the Pt thin film, as the pressure increases.

EXAMPLE 2

In order to determine the proper mixing ratio of the gas mixture, the experimental conditions were set to the same as Example 1, except the pressure of the reaction chamber was set to 300 mTorr and the mixing ratio of the chlorine:carbon dioxide was varied to 1:0.005, 1:0.01, 1:1:, 1:10, 1:100, 1:150 and 1:200. The etching of the Pt was directly detected using an etching end point detector.

As the result of Example 2, the etching of Pt was not completed when the mixing ratio was 1:0.005 and 1:150. At mixing ratio of 1:0.005, the halide is not converted completely to the carbonyl compound since the ratio of carbon dioxide is very low. On the contrary, at mixing ratio of 1:150, insufficient halide is formed for the conversion into a volatile compound, since the mixing ratio of the halogen gas is very low. Accordingly, under these conditions, the transition metal thin film was not etched completely.

Thus, preferably, the mixing ratio of chlorine:carbon dioxide is 1:0.01~1:100.

EXAMPLE 3

In order to determine the mixing ratio of the gas mixture giving the maximum etching rate, the experimental conditions were set to the same as Example 2 except the mixing ratio of the chlorine:carbon monoxide (chlorine %) was varied to 1:0.43 (70%), 1:1 (50%), 1:1.5 (40%), 1:2.3 (30%) and 1:4 (20%) to etch the Pt thin film.

Figure 4:
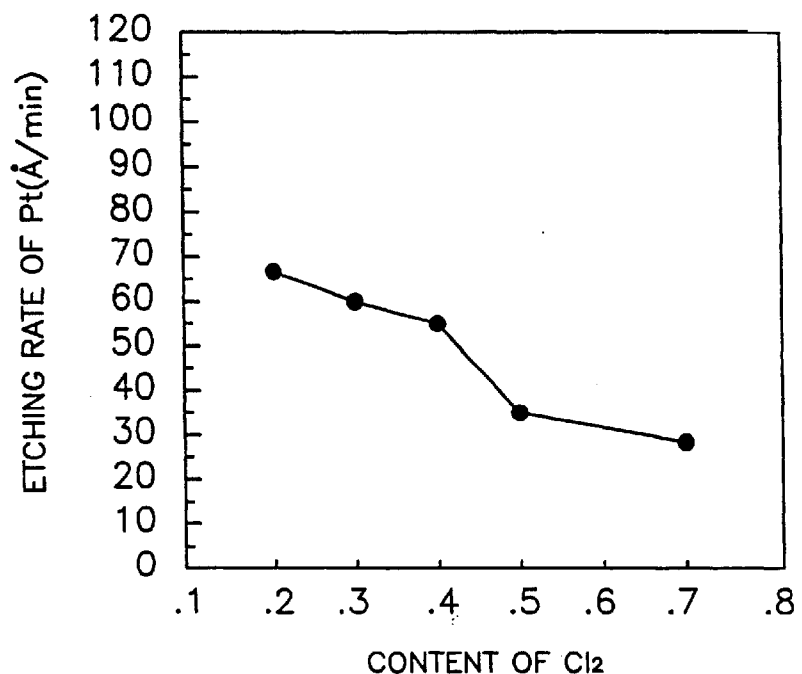
FIG. 4 is a graph showing the relationship between the mixing ratio of an etching gas mixture and the etching rate of the Pt thin film.
Figure 5:
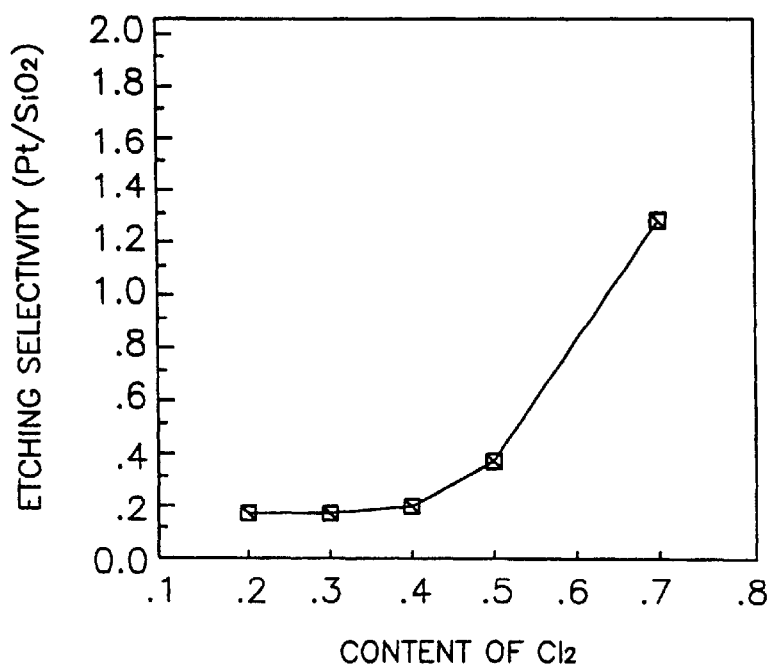
FIG. 5 is a graph showing the relationship between the mixing ratio of the etching gas mixture and the etching selectivity of Pt thin film with respect to the oxide layer.

The relationship of the mixing ratio of the chlorine gas with the etching rate of the Pt thin film, and the relationship of the mixing ratio of the chlorine gas with the etching selectivity of the Pt thin film with respect to the oxide layer, according to Example 3, were shown in FIGS. 4 and 5. From FIG. 4, it can be seen that the etching ratio of the Pt thin film decreases as the mixing ratio of the chlorine gas increases. On the contrary, it can be seen from FIG. 5 that the etching selectivity of the Pt thin film with respect to the oxide layer increases as the mixing ratio of the chlorine gas increases. Thus, provided whether the etching rate or the etching selectivity is more important in the process, the mixing ratio of chlorine to carbon monoxide can be controlled appropriately according to the conditions.

EXAMPLE 4

In order to determine the relationship of the reaction temperature to the etching rate, the experimental conditions were set to the same as Example 2 except the temperature of the reaction chamber was varied over 50~350° C. and the mixing ratio of the chlorine:carbon monoxide was varied to 1:1 and 1:2.3.

Figure 6:
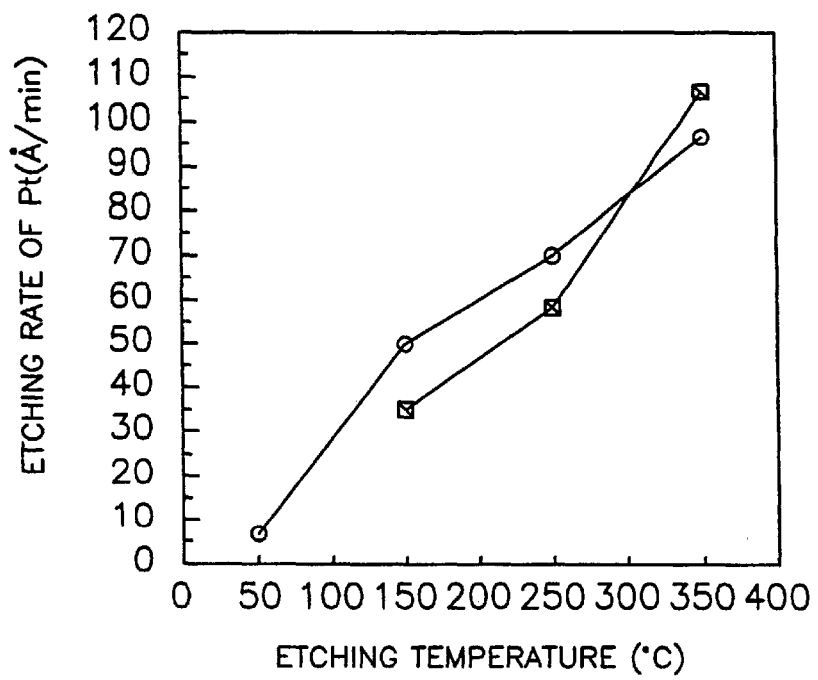
FIG. 6 is a graph showing the relationship between the reaction temperature and the etching rate of the Pt thin film.
Figure 7:
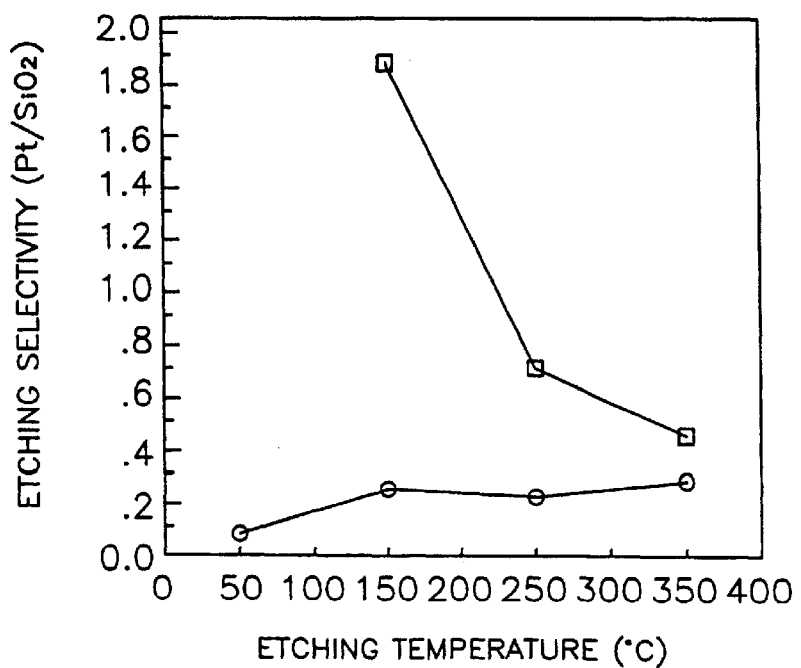
FIG. 7 is a graph showing the relationship between the reaction temperature and the etching selectivity of the Pt thin film with respect to the oxide layer.

FIG. 6 shows the change of the etching rate of the Pt thin film and FIG. 7 shows the change of the etching selectivity of the Pt thin film with respect to the oxide layer. In FIGS. 6 and 7, the rectangular graph points represent the results when the mixing ratio of the chlorine:carbon monoxide is 1:1 (chlorine 50%), and the circular graph points represent the results when the mixing ratio of chlorine:carbon monoxide is 1:2.3 (chlorine 30%). From FIG. 6, it can be seen that the etching rate of the Pt thin film increases as the temperature increases, regardless of the mixing ratio of the chlorine gas. According to FIG. 7, when the mixing ratio of the chlorine gas is low as 30% (represented by the circles), the etching selectivity of the Pt thin film with respect to the oxide layer increases together with the increases of the temperature. On the contrary, when the mixing ratio of the chlorine gas is high as 50% (represented by the rectangles), the etching selectivity decreases as the temperature increases.

Therefore, it can be seen from the results of Examples 1 through 4 that the intended pattern of the Pt thin film can be obtained by appropriately controlling the temperature and pressure of the etching apparatus and the mixing ratio of the etching gas.

EXAMPLE 5

In order to determine a volatilization starting temperature of the Pt carbonyl chloride, the experimental conditions were set to the same as Example 4, except the temperature of the reaction chamber was varied to 200°C., 210°C., 215°C., 220°C., 225°C. and 230°C. and the mixing ratio of the chlorine:carbon monoxide of the etching gas mixture was 1:2.

Figure 8:
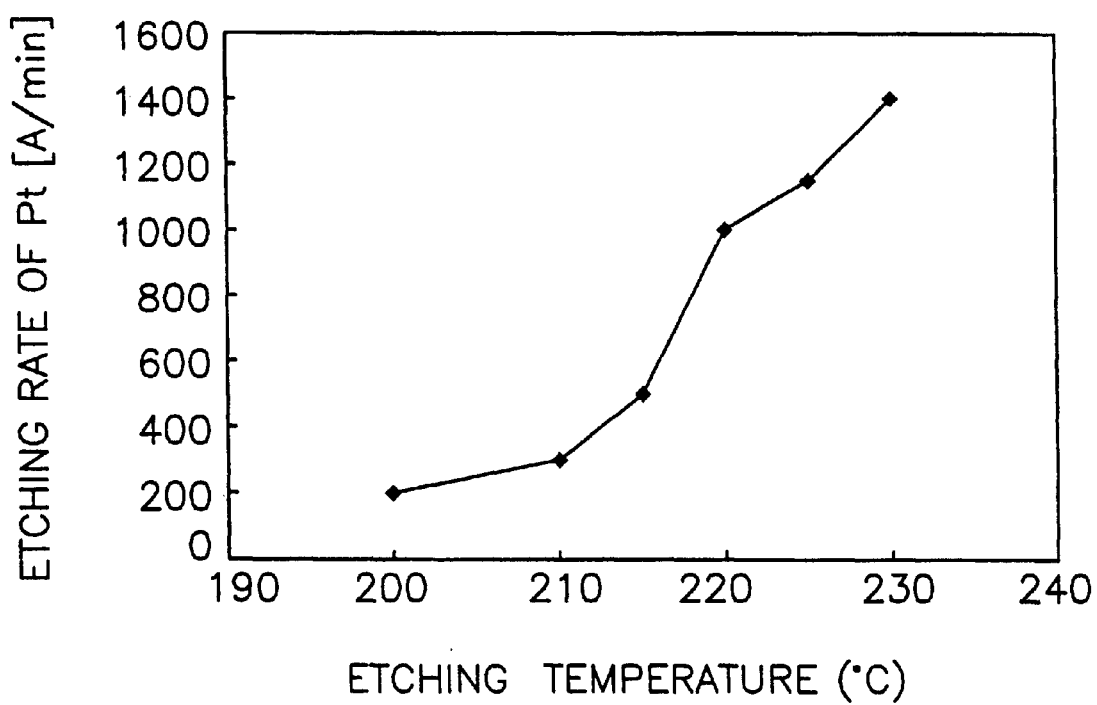
FIG. 8 is a graph showing the relationship of the reaction temperature and the etching rate of the Pt thin film to find out the volatile temperature of Pt carbonyl chloride.

The relationship of the etching temperature and the etching rate according to Example 5 is shown in FIG. 8. In FIG. 8, the sudden change of the etching rate at 210–220° C. implies that the Pt carbonyl chloride is volatilized at about 210° C. That is, the etching can be performed at a lower temperature of 210° C. compared with a conventional high temperature etching process. Thus, a photoresist which was unstable at a high temperature and stable at a lower temperature could conveniently be used as a mask pattern in the process.

EXAMPLE 6

In order to check whether the transition metal thin film, e.g., Pt thin film, is completely removed by being volatilized through the etching process, the Pt thin film was formed through the same process as Example 1, and then surface composition was analyzed by X-ray photoelectron spectroscopy (XPS) before etching, during etching and after etching. Here, the etching process was performed at 210° C. under the atmospheric pressure using the etching gas mixture including chlorine and carbon monoxide with a mixing ratio of 1:2.

Figure 9:
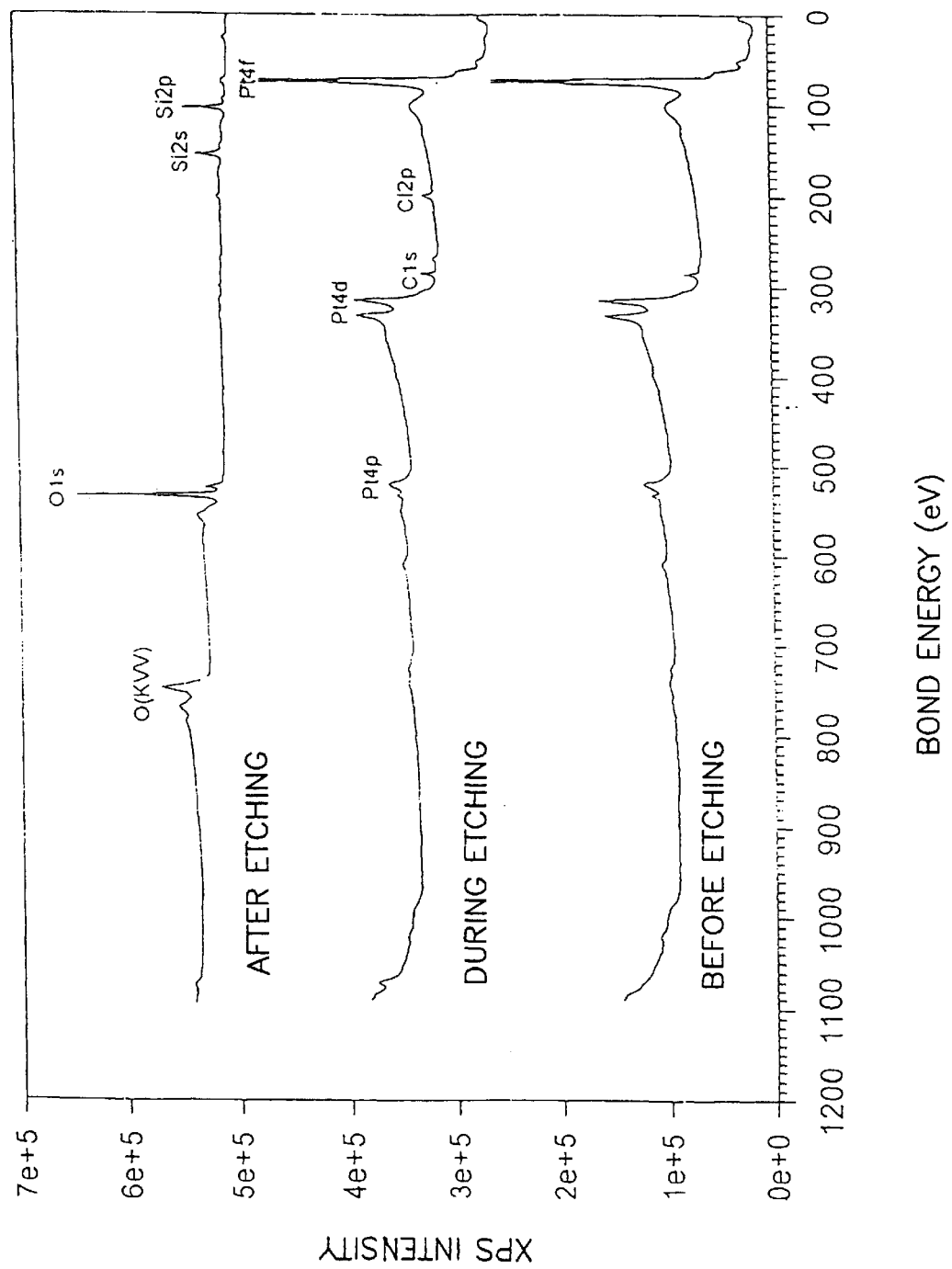
FIG. 9 is a graph showing the results of X-ray photoelectron spectroscopy before etching, during etching and after etching.

The result is shown in FIG. 9. Here, the Pt component is completely removed so that the surface of the silicon oxide is layer is exposed.

According to the present invention, a highly volatile metal halide is formed by the reaction between the transition metal thin film and the etching gas. Since the volatile metal halide is easily vaporized or sublimated, redeposition does not occur on the transition metal thin film pattern. Thus, a fine pattern having good profile can be formed at a high etching rate. Also, the etching is performed through a chemical reaction, so that the selectivity with respect to a mask or an under material layer is high.

What is claimed is:

1. A method for etching a transition metal thin film, comprising the steps of:

(a) loading a semiconductor substrate having the transition metal thin film in a reaction chamber, wherein the transition metal thin film is a ferroelectric capacitor electrode film selected from the group consisting of Ru, Ir, Rh, Pt, and Ni; and (b) injecting into the reaction chamber an etching gas mixture comprising a first gas which is one selected from the group consisting of halogen gas, halide gas, halogen gas mixture, halide gas mixture and gas mixture of halogen and halide, and a second gas which is one selected from the group consisting of carbon oxide gas, hydrocarbon gas, and nitrogen-containing gas, to form a volatile metal halide through a reaction between the transition metal thin film and the etching gas mixture, thereby etching the transition metal thin film and converting the film into an organic metal halide, a metal amine halide, or a metal nitrosohalide, wherein the hydrocarbon gas comprises one selected from the group consisting of benzene, cyclopentadiene, toluene, and butadiene.

2. The method according to claim 1, wherein the mixing ratio of the first gas to the second gas is 1:0.01 to 1:100.

3. The method according to claim 1, wherein the mixing ratio of the first gas to the second gas is controlled to multiple levels.

4. The method according to claim 1, wherein the halogen gas comprises one selected from the group consisting of chloride ($Cl_2$), fluorine ($F_2$), bromine ($Br_2$), and iodine ($I_2$), and the halide gas comprises one selected from the group consisting of chloride gas, fluoride gas, bromide gas, and iodide gas.

5. The method according to claim 1, wherein the carbon oxide gas comprises one selected from the group consisting of carbon monoxide (CO), carbon dioxide ($CO_2$), and carbonyl compound.

6. The method according to claim 1, wherein the nitrogen-containing gas is ammonia ($NH_3$).

7. The method according to claim 1, wherein the nitrogen-containing gas comprises one selected from the group consisting of nitrogen monoxide (NO). nitrogen dioxide ($NO_2$) and ammonia ($NH_3$).

8. The method according to claim 1, wherein the temperature of the reaction chamber is 0° C. to 500° C.

9. The method according to claim 1, wherein step (b) further comprising the steps of:

injecting the etching gas mixture to the reaction chamber under a predetermined pressure;

forming a plasma in the reaction chamber;

activating the etching gas mixture in the plasma;

reacting the activated etching gas mixture with the transition metal thin film to form the volatile metal halide; and volatilizing the volatile metal halide.

10. The method according to claim 9, wherein the pressure of the reaction chamber is $7.6 \times 10^3$ Torr.

11. The method according to claim 9, wherein the semiconductor substrate is loaded onto an electrode and radio frequency power is applied to the electrode to perform a reactive ion etching.

12. The method according to claim 9, wherein the temperature at the wall of the reaction chamber is higher than that of the semiconductor substrate, such that the volatile metal halide is easily volatilized.

13. The method according to claim 9, wherein the etching gas mixture further includes a third gas selected from the group consisting of oxygen, nitrogen, fluorocarbon, and inert gas.

14. A method for etching a transition metal thin film comprising the steps of:
- (a) loading a semiconductor substrate having the transition metal thin film into a reaction chamber, the transition metal thin film being a ferroelectric capacitor electrode film selected from the group consisting of Ru, Ir, Rh, Pt, and Ni;
- (b) injecting a first gas which is one selected from the group consisting of halogen gas, halide gas, halogen gas mixture, halide gas mixture, and gas mixture of halogen and halide, to react with the transition metal thin film, thereby forming a metal halide; and
- (c) injecting a second gas which is one selected from the group consisting of carbon oxide gas, hydrocarbon gas, and nitrogen-containing gas, to react with the metal halide, thereby forming a volatile metal halide selected from the group consisting of an organic metal halide, a metal amine halide and a metal nitrosohalide, wherein the hydrocarbon gas comprises one selected from the group consisting of benzene, cyclopentadiene, toluene, and butadiene.

15. The method according to claim 14, wherein the mixing ratio of the first gas to the second gas is 1:0.01 to 1:100.

16. The method according to claim 14, wherein the mixing ratio of the first gas to the second gas is controlled to multiple levels.

17. The method according to claim 14, wherein the halogen gas comprises one selected from the group consisting of chloride ($Cl_2$), fluorine ($F_2$), bromine ($Br_2$), and iodine ($I_2$), and the halide gas comprises one selected from the group consisting of chloride gas, fluoride gas, bromide gas, and iodide gas.

18. The method according to claim 14, wherein the carbon oxide gas comprises one selected from the group consisting of carbon monoxide (CO), carbon dioxide ($CO_2$), and carbonyl compound.

19. The method according to claim 14, wherein the nitrogen-containing gas is ammonia ($NH_3$).

20. The method according to claim 14, wherein the nitrogen-containing gas comprises one selected from the group consisting of nitrogen monoxide (NO). nitrogen dioxide ($NO_2$) and ammonia ($NH_3$).

21. The method according to claim 14, wherein the temperature of the reaction chamber is 0° C. to 500° C.

22. The method according to claim 14, wherein step (b) further comprising the steps of:
- injecting the etching gas mixture to the reaction chamber under a predetermined pressure;
- forming a plasma in the reaction chamber;
- activating the etching gas mixture in the plasma;
- reacting the activated etching gas mixture with the transition metal thin film to form the volatile metal halide; and
- volatilizing the volatile metal halide.

23. The method according to claim 22, wherein the pressure of the reaction chamber is $7.6 \times 10^3$ Torr.

24. The method according to claim 22, wherein the semiconductor substrate is loaded onto an electrode and radio frequency power is applied to the electrode to perform a reactive ion etching.

25. The method according to claim 22, wherein the temperature at the wall of the reaction chamber is higher than that of the semiconductor substrate, such that the volatile metal halide is easily volatilized.

26. The method according to claim 22, wherein the etching gas mixture further includes a third gas selected from the group consisting of oxygen, nitrogen, fluorocarbon, and inert gas.

* * * * *